(12) United States Patent
Favre et al.

(10) Patent No.: US 11,862,738 B2
(45) Date of Patent: Jan. 2, 2024

(54) PHOTOVOLTAIC CELL WITH PASSIVATED CONTACTS AND WITH NON-REFLECTIVE COATING

(71) Applicant: COMMISSARIAT A L'ENERGIE ATOMIQUE ET AUX ENERGIES ALTERNATIVES, Paris (FR)

(72) Inventors: Wilfried Favre, Grenoble (FR); Adrien Danel, Grenoble (FR); Frédéric Jay, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/065,699

(22) Filed: Dec. 14, 2022

(65) Prior Publication Data
US 2023/0197864 A1 Jun. 22, 2023

(30) Foreign Application Priority Data
Dec. 16, 2021 (FR) ...................................... 21 13720

(51) Int. Cl.
*H01L 31/0216* (2014.01)
*H01L 31/0224* (2006.01)

(52) U.S. Cl.
CPC ............ *H01L 31/02168* (2013.01); *H01L 31/022466* (2013.01)

(58) Field of Classification Search
None
See application file for complete search history.

(56) References Cited

U.S. PATENT DOCUMENTS

| | | | |
|---|---|---|---|
| 5,935,344 A | 8/1999 | Endo et al. | |
| 5,936,395 A * | 8/1999 | Kevorkian | G01R 15/241 324/96 |
| 9,722,104 B2 * | 8/2017 | Ha | H01L 31/0747 |

(Continued)

FOREIGN PATENT DOCUMENTS

| | | |
|---|---|---|
| EP | 2 450 970 A1 | 5/2012 |
| WO | WO 2021/044232 A1 | 3/2021 |

OTHER PUBLICATIONS

French Preliminary Search Report dated Jun. 15, 2022 in French Application 21 13720 filed on Dec. 16, 2021 (with English Translation of Categories of Cited Documents), citing documents 1-6 & 15-16 therein, 2 pages.

(Continued)

*Primary Examiner* — Golam Mowla
(74) *Attorney, Agent, or Firm* — Oblon, McClelland, Maier & Neustadt, L.L.P.

(57) ABSTRACT

Photovoltaic cell comprising, an assembly comprising a substrate, first and second passivation layers covering opposite faces of the substrate and also lateral faces of the substrate, and first and second charge-collecting layers; a first layer of TCO disposed against the first main face of the assembly and such that edges of the first main face of the assembly are not covered by the first layer of TCO; a second layer of TCO covering the whole of the second main face of the assembly; a non-reflective coating partly covering the first and/or second charge-collecting layers on the lateral faces of the substrate and not covered by the second layer of TCO, and also covering the edges of the first main face.

14 Claims, 3 Drawing Sheets

(56) References Cited

U.S. PATENT DOCUMENTS

| | | | |
|---|---|---|---|
| 2001/0054436 A1* | 12/2001 | Mukai | H01L 31/075 |
| | | | 136/251 |
| 2011/0100459 A1 | 5/2011 | Yoon et al. | |
| 2015/0214398 A1 | 7/2015 | Watahiki et al. | |
| 2016/0133779 A1 | 5/2016 | Adachi et al. | |
| 2016/0155866 A1* | 6/2016 | Ha | H01L 31/02168 |
| | | | 136/255 |
| 2017/0207351 A1 | 7/2017 | Lee et al. | |
| 2020/0313020 A1 | 10/2020 | Sakuma et al. | |

OTHER PUBLICATIONS

Janke et al., "Quantifying & Reducing Edge Losses in Silicon Heterojunction Solar Cells", 36th European Photovoltaic Solar Energy Conference and Exhibition, 2019, 39 pages.

Roß et al., "Co-Evaporated Formamidinium Lead Iodide Based Perovskites with 1000 h Constant Stability for Fully Textured Monolithic Perovskite/Silicon Tandem Solar Cells", Advanced Energy Materials, vol. 11, Issue 35, 2021, 14 pages.

* cited by examiner

PHOTOVOLTAIC CELL WITH PASSIVATED CONTACTS AND WITH NON-REFLECTIVE COATING

TECHNICAL FIELD

The invention relates to the field of photovoltaic cells with passivated contacts. The invention advantageously relates to a heterojunction photovoltaic cell, or a photovoltaic cell of the TOPCon ("Tunnel Oxide Passivated Contact") type, or a photovoltaic cell of the tandem on semiconductor type, for example with a perovskite on silicon (PK/Si) structure.

PRIOR ART

In the field of photovoltaic cells comprising an absorber (corresponding to the wafer used) made from crystalline semiconductor, the best efficiencies are obtained for so-called passivated-contacts technologies. A cell with passivated contacts includes one or more thin layers interposed between the metallisations and the absorber and which make it possible to avoid direct contact between the metallisations and the absorber. This makes it possible to greatly limit recombinations of charge carriers generated under illumination and to achieve open-circuit voltages that are much higher than the other technologies with direct metallisation-absorber contacts, over the entire surface or localised on a part of the surface of the absorber (AI-BSF, PERC).

To provide the lateral transport of the charges from the absorber to the metallisations, it is necessary to use transparent conductive layers, since transporting these charges by the absorber alone is not generally sufficient. These layers serve both as non-reflective layers and layers for lateral transport of the charges, in particular on the face collecting minority carriers, (i.e. the holes in the case of an absorber made from negatively doped crystalline silicon). These layers correspond to layers of TCO ("Transparent Conductive Oxide"), and advantageously ITO (indium tin oxide).

When the cell is produced, the layers of TCO are deposited on the front face (which is the face exposed to direct light radiation) and on the rear face of the cell. Material of these TCO layers is however found on the lateral flanks, or lateral faces, of the cell. However, on these lateral faces, it is necessary to avoid overlap of the front and rear TCO layers to avoid the formation of short-circuits between the n- and p-doped parts of the cell.

To avoid such overlap, the document by Janke et al., "Quantifying & Reducing Edge Losses in Silicon Heterojunction Solar Cells", 36th European Photovoltaic Solar Energy Conference and Exhibition, 2CO.11.2, proposes covering the edges of the rear face of a cell with reverse emitter heterojunction (junction formed on the rear face of the cell) by a mask when the rear TCO layer is deposited. The presence of this mask makes it possible to avoid the deposition of TCO on the edges of the rear face of the cell and thus to avoid contact with the front TCO layer at the lateral faces of the cell. Nevertheless, this technique involves part of the rear face of the cell not being covered with TCO, which is detrimental to the performances of the cell in the case of a reverse emitter cell. This document also describes that masking the edges of the front face of the cell gives rise to the creation of short-circuits between the front and rear faces of the cell. In addition, not covering the entire front face of the cell with TCO is, in the case described in this document, problematic since this reduces the surface area of the cell exposed to direct light and which is covered by a non-reflective layer.

The problems described above for a photovoltaic cell with heterojunction are also found with photovoltaic cells of the TOPCon type or of the tandem on semiconductor type.

DESCRIPTION OF THE INVENTION

Thus there is a need to propose a photovoltaic cell with crystalline semiconductor absorber and with passivated contacts, wherein the short-circuits between the p- and n-doped parts of the cell are avoided, and the performances of which are little impaired by part of the cell not being covered with TCO, while in particular limiting the optical losses within the cell.

For this purpose, one embodiment proposes a photovoltaic cell comprising at least:

an assembly comprising at least one p-n junction including at least one crystalline semiconductor substrate doped according to a first conductivity type, first and second passivation layers covering respectively first and second opposite main faces of the substrate and each also covering lateral faces of the substrate, a first charge-collecting layer configured for extracting and collecting charges of the first type of conductivity and disposed against the first passivation layer, and a second charge-collecting layer configured for extracting and collecting charges of a second type of conductivity, opposite to the first type of conductivity, and disposed against the second passivation layer, said assembly furthermore comprising a first main face disposed on the same side as the first main face of the substrate and a second main face disposed on the same side as the second main face of the substrate;

a first layer of conductive transparent oxide disposed against a part of the first main face of the assembly and such that edges of the first main face of the assembly are not covered with the first layer of conductive transparent oxide;

a second layer of conductive transparent oxide covering the whole of the second main face of the assembly and partially covering first parts of the first charge-collecting layer and/or of the second charge-collecting layer disposed on the same side as the lateral faces of the substrate;

electrically conductive contacts disposed against the first and second layers of conductive transparent oxide;

a non-reflective coating at least partially covering second parts of the first charge-collecting layer and/or of the second charge-collecting layer disposed on the lateral faces of the substrate and not covered with the second layer of conductive transparent oxide, and also covering the edges of the first main face.

In this cell, it is proposed producing first and second layers of conductive transparent oxide so that, at the second charge-collecting layer, the second layer of conductive transparent oxide entirely covers the second main face of the assembly including the p-n junction, which makes it possible to maximise the collection of minority charges on this side of the cell. At the first charge-collecting layer, good lateral conduction of the charges towards the second electrically conductive contact is obtained in this cell.

In addition, at the first charge-collecting layer, edges of the first main face are not covered by the first layer of conductive transparent oxide, in order to guarantee the absence of short-circuit in the cell.

Furthermore, it is proposed adding a non-reflective coating at least partially covering parts of the charge-collecting layers located against the lateral faces of the substrate and which are not covered by the second layer of conductive transparent oxide, and also covering the edges of the first main face. Adding this non-reflective coating makes it possible to limit the current losses related to the non-covering of the edges by the first layer of conductive transparent oxide (which causes optical losses) by virtue of an optical confinement obtained by means of the non-reflective coating.

According to an advantageous embodiment, the substrate of the photovoltaic cell corresponds to an n-type crystalline silicon wafer, and the cell is of the type with reverse emitter (layer with conductivity opposite to that of the substrate disposed on the side of the cell not receiving direct radiation).

Furthermore, when the non-reflective coating includes a dielectric material, this non-reflective coating can help to guarantee the absence of short-circuit between the layers with different conductivities of the cell.

Throughout the document, the face or faces referred to as "main faces" of an element designate the faces with the largest dimensions of this element.

The lateral faces of the substrate may be perpendicular to the main faces of the substrate.

The non-reflective coating may furthermore cover the first layer of conductive transparent oxide and the electrically conductive contacts disposed against the first layer of conductive transparent oxide.

The non-reflective coating may be dielectric and may furthermore at least partially cover the second layer of conductive transparent oxide and the electrically conductive contacts disposed against the second layer of conductive transparent oxide.

The edges of the first main face may form, in a plane parallel to the first main face, a contour with a width of less than or equal to 500 μm. Advantageously, this width may be between 100 μm and 500 μm.

The non-reflective coating may include at least one of the following materials: silicon nitride, silicon oxide, silicon oxynitride, aluminium-doped zinc oxide.

The non-reflective coating may have a refractive index the value of which is between that of the refractive index of the first layer of conductive transparent oxide and that of a material encapsulating the photovoltaic cell.

The non-reflective coating may form a layer with a thickness of between 5 nm and 100 nm.

The semiconductor of the substrate and of the first and second charge-collecting layers may include silicon.

In a first configuration, the photovoltaic cell may be a heterojunction cell, and:
  the first and second passivation layers may include amorphous, or nanocrystalline, or microcrystalline semiconductor, not intentionally doped, and
  the first and second charge-collecting layers may include doped amorphous, or nanocrystalline, or microcrystalline semiconductor.

In a second configuration, the photovoltaic cell may be a cell of the TOPCon type, and:
  the first and second passivation layers may correspond to tunnel oxide layers, and
  the first and second charge-collecting layers may include doped polycrystalline semiconductor.

In a third configuration, the photovoltaic cell may be of the tandem on semiconductor type, and:
  the substrate, the first and second passivation layers and the first and second charge-collecting layers may form a bottom cell of the photovoltaic cell, a main face of the bottom cell being able to form the second main face of said assembly;
  said assembly may furthermore include a top cell disposed on the bottom cell, a main face of the top cell being able to form the first main face of said assembly.

The top cell may include at least one layer of material with a perovskite structure.

Another embodiment relates to a method for producing a photovoltaic cell, including the implementation of the following steps:
  producing an assembly comprising at least one p-n junction including at least one crystalline semiconductor substrate doped according to a first conductivity type, first and second passivation layers respectively covering first and second opposite main faces of the substrate and each also covering lateral faces of the substrate, a first charge-collecting layer configured for extracting and collecting charges of the first conductivity type and disposed against the first passivation layer, and a second charge-collecting layer configured for extracting and collecting charges of a second conductivity type, opposite to the first conductivity type, and disposed against the second passivation layer, said assembly furthermore comprising a first main face disposed on the same side as the first main face of the substrate and a second main face disposed on the same side as the second main face of the substrate;
  producing a first layer of conductive transparent oxide disposed against a part of the first main face of the assembly and so that the edges of the first main face of the assembly are not covered by the first layer of conductive transparent oxide;
  producing a second layer of conductive transparent oxide covering the whole of the second main face of the assembly and partially covering first parts of the first charge-collecting layer and/or of the second charge-collecting layer disposed on the lateral faces of the substrate;
  producing electrically conductive contacts disposed against the first and second layers of conductive transparent oxide;
  producing a non-reflective coating at least partially covering second parts of the first charge-collecting layer and/or of the second charge-collecting layer disposed on the same side as the lateral faces of the substrate and not covered by the second layer of conductive transparent oxide, and also covering the edges of the first main face.

In a particular configuration:
  the steps of the method may form a plurality of photovoltaic cells;
  the method may furthermore include a step of electrical interconnection of the photovoltaic cells with each other, implemented between the production of the electrically conductive contacts of the cells and the production of the non-reflective coating.

BRIEF DESCRIPTION OF THE DRAWINGS

The present invention will be best understood from the reading of the description of example embodiments given purely by way of indication and in no way limitatively, referring to the accompanying drawings, in which.

Identical, similar or equivalent parts of the various figures described below bear the same numerical references so as to facilitate passing from one figure to another.

The various parts shown on the figures are not necessarily shown to a uniform scale, to make the figures more legible.

The various possibilities (variants and embodiments) must be understood not to be exclusive of one another and may be combined with one another.

DETAILED DESCRIPTION OF PARTICULAR EMBODIMENTS

A photovoltaic cell 100 according to a first embodiment is described below in relation to FIG. 1. In this example, the cell 100 is a heterojunction cell.

The cell 100 includes at least one p-n junction including an absorber formed by a crystalline semiconductor substrate 102 doped according to a first conductivity type. In the example embodiment described here, the substrate 102 includes n-doped crystalline silicon.

The cell 100 includes a first charge-collecting layer 104 configured for extracting and collecting charges of the first conductivity type (electrons in the example described here). According to an example embodiment, the first charge-collecting layer 104 includes amorphous semiconductor (hydrogenated amorphous silicon in this example), doped according to the first conductivity type (n-doped in this example).

The cell 100 also includes a first passivation layer 106 covering a first main face of the substrate 102 so that the first passivation layer 106 is disposed between this first main face of the substrate 102 and the first charge-collecting layer 104. In this example embodiment, the first passivation layer 106 includes amorphous semiconductor (hydrogenated amorphous silicon in this example), not intentionally doped.

The cell 100 also includes a second charge-collecting layer 108 configured for extracting and collecting charges of the second conductivity type (holes in the example described here). According to an example embodiment, the second charge-collecting layer 108 includes amorphous semiconductor (hydrogenated amorphous silicon in this example) doped according to the second conductivity type (p doped in this example).

The cell 100 also includes a second passivation layer 110 covering a second main face of the substrate 102 so that the second passivation layer 110 is disposed between this second main face of the substrate 102 and the second charge-collecting layer 108. In this example embodiment, the second passivation layer 110 includes amorphous semiconductor (hydrogenated amorphous silicon in this example) not intentionally doped.

The layers 104, 106, 108 and 110 each have for example a thickness of between 2 nm and 20 nm, and advantageously less than 15 nm.

The substrate 102 and the layers 104, 106, 108 and 110 form an assembly provided with a first main face 112 disposed on the same side as the first main face of the substrate 102 and a second main face 112 opposite and disposed on the same side as the second main face of the substrate 102. In the example embodiment described here, the first and second main faces 112, 114 are formed respectively by the surfaces of the first and second charge-collecting layers 104, 108 opposite to those in contact with the first and second passivation layers 106, 110.

According to an example embodiment of the cell 100, the first passivation layer 106 and the first charge-collecting layer 104 are first of all disposed on the same side as the first main face of the substrate 102. Use of these deposits gives rise to a deposit of portions of these first layers 104, 106 against at least a part of the lateral faces 116 of the substrate 102. The second passivation layer 110 and the second charge-collecting layer 110 are next deposited on the second main face of the substrate 102, opposite to the first main face of the substrate 102. Use of these deposits gives rise to a deposit of portions of the second layers 108, 110 against any parts of the lateral faces 116 of the substrate 102 not covered by the first layers 104, 106, and optionally against a part of the portions of the first layers 104, 106 located against the lateral faces 116 of the substrate 102. The layers 104, 106, 108 and 110 are for example deposited by PECVD (plasma enhanced chemical vapour deposition) or HWCVD (hot wire chemical vapour deposition).

The cell 100 also includes a first layer of conductive transparent oxide (TCO) 118 disposed against a part of the first main face 112. Furthermore, the form of the first layer of TCO 118 is such that the edges 120 of the first main face 112 are not covered by the first layer of TCO 118. This non-covering of the edges 120 of the first main face 112 by the first layer of TCO 118 is for example obtained by using a deposit of the first layer of TCO 118 through an element masking the edges 120. This masking element corresponds for example to the support on which the cell 100 is disposed when the first layer of TCO 118 is deposited.

In the example embodiment described here, the edges 120 of the first main face 112 form, in a plane parallel to the first main face 112, a contour with a width (the dimension referenced "a" on FIG. 1) less than or equal to 500 μm, and for example between 100 μm and 500 μm.

The cell 100 also includes a second layer of TCO 122 covering the whole of the second main face 114 and also covering at least first parts of the first charge-collecting layer 104 and/or of the second charge-collecting layer 108 disposed on the lateral faces 116 of the substrate 102. In the example in FIG. 1, the second layer of TCO 122 covers the whole of the second main face 114 as well as some of the portions of the second charge-collecting layer 108 disposed on the lateral faces 116 of the substrate 102.

Advantageously, the TCO of the layers 118, 122 corresponds to indium tin oxide (ITO). Furthermore, the material of the first layer of TCO 118 may be identical to or different from the material of the second layer of TCO 122. The thickness of each of the layers of TCO 118, 122 is for example between 5 nm and 100 nm. This thickness of each of the layers of TCO 118, 122 is advantageously constant. The layers of TCO 118, 122 are for example deposited by cathodic sputtering or by PVD (physical vapour deposition), or by PLD (pulsed laser deposition).

The cell 100 also includes first electrically conductive contacts 124 disposed against the first layer of TCO 118 and second electrically conductive contacts 126 disposed against the second layer of TCO 122. These electrically conductive contacts 124, 126 advantageously include at least one metallic material such as silver, copper or aluminium. These electrically conductive contacts 124, 126 correspond to the metallisation fingers of the cell 100 and to the busbars of the cell 100 (on FIG. 1, only the metallisation fingers are shown). By way of example, the width (bearing the reference "b" on FIG. 1) of each of these metallisation fingers is for example between 30 μm and 50 μm, and the thickness thereof is for example of the order of 8 μm.

Finally, the cell 100 includes a non-reflective coating 128 covering at least second parts of the first charge-collecting layer 104 and/or of the second charge-collecting layer 108 disposed against the side of the lateral faces 116 of the substrate 102 and not covered by the second layer of TCO 122, and also covering the edges 120 of the first main face 112. In the first embodiment described in relation to FIG. 1, the coating 122 also covers:

- the first layer of TCO 118 and the first electrically conductive contacts 124 disposed against the first layer of TCO 118, and
- the second layer of TCO 122 and the second electrically conductive contacts 126 disposed against the second layer of TCO 122.

In this first embodiment, the non-reflective coating 128 forms an envelope surrounding the whole of the various elements of the cell 100. Thus the non-reflective coating 128 also forms a moisture-barrier layer.

The thickness of the non-reflective coating 128 is for example between 5 nm and 100 nm.

Because, in this first embodiment, the non-reflective coating 128 is in contact with the first and second charge-collecting layers 104, 108 and with the second layer of TCO 122, the material of the non-reflective coating 128 is dielectric.

The non-reflective coating 128 includes for example silicon nitride, for example in the form of SiN or in another stoichiometric form, and/or silicon oxide, for example in the form of $SiO_2$ or in another stoichiometric form.

Figure 1:
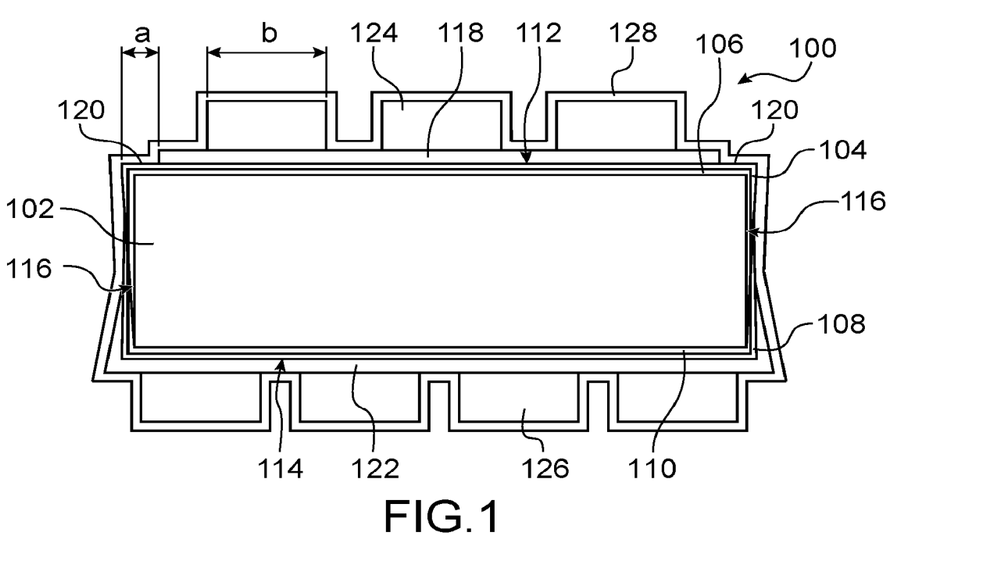
FIGS. 1 to 6 show heterojunction photovoltaic cells with passivated contacts and non-reflective coating according to various embodiments.

Furthermore, so that the non-reflective coating 128 has good optical properties, the material of the coating 128 can be selected so that it has a refractive index the value of which is between that of the refractive index of the first layer of TCO 118 and that of a material encapsulating the cell 100, not visible on FIG. 1, covering the coating 128.

In this first embodiment, the non-reflective coating 128 is for example deposited by ALD ("Atomic Layer Deposition"), which makes it possible to deposit the coating 128 on all the sides of the cell 100.

Figure 2:
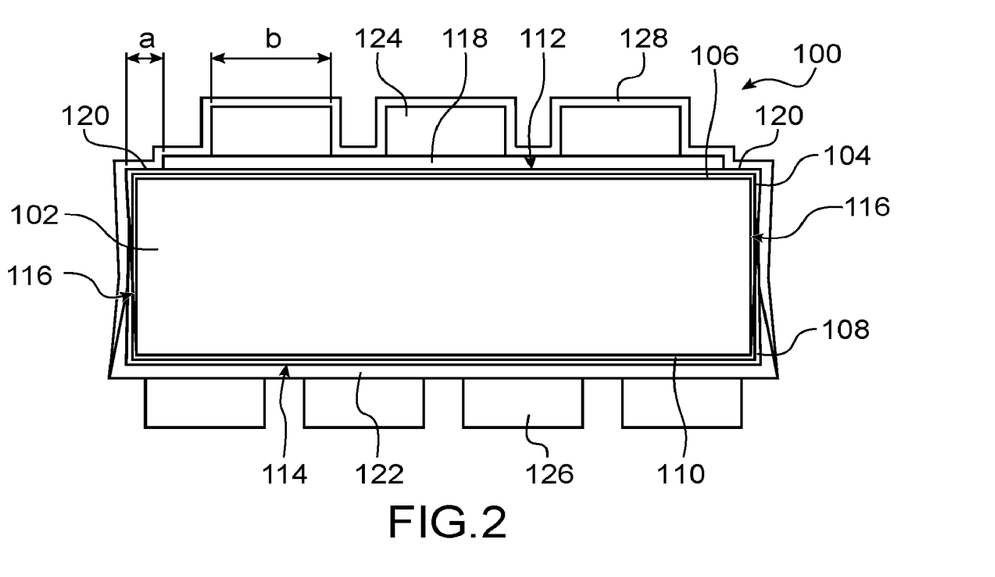

A photovoltaic cell 100 according to a second embodiment is described below in relation to FIG. 2.

Compared with the first embodiment previously described, the non-reflective coating 128 does not form an envelope surrounding all the various elements of the cell 100. This is because, in this second embodiment, the non-reflective coating 128 covers:

- the second parts of the first charge-collecting layer 104 and/or of the second charge-collecting layer 108 disposed on the same side as the lateral faces 116 of the substrate 102 and not covered by the second layer of TCO 122, and
- the edges 120 of the first main face 112, and
- the first layer of TCO 118 and the first electrically conductive contacts 124.

Because, in this second embodiment, the non-reflective coating 128 is in contact with the first and second charge-collecting layers 104, 108 and with the second layer of TCO 122, the material of the non-reflective coating 128 is dielectric.

In this second embodiment, the non-reflective coating 128 is for example deposited by PECVD (plasma enhanced chemical vapour deposition) or PVD (physical vapour deposition), with the cell 100 disposed on a support so that the second layer of TCO 122 is located on the same side as this support.

Figure 3:
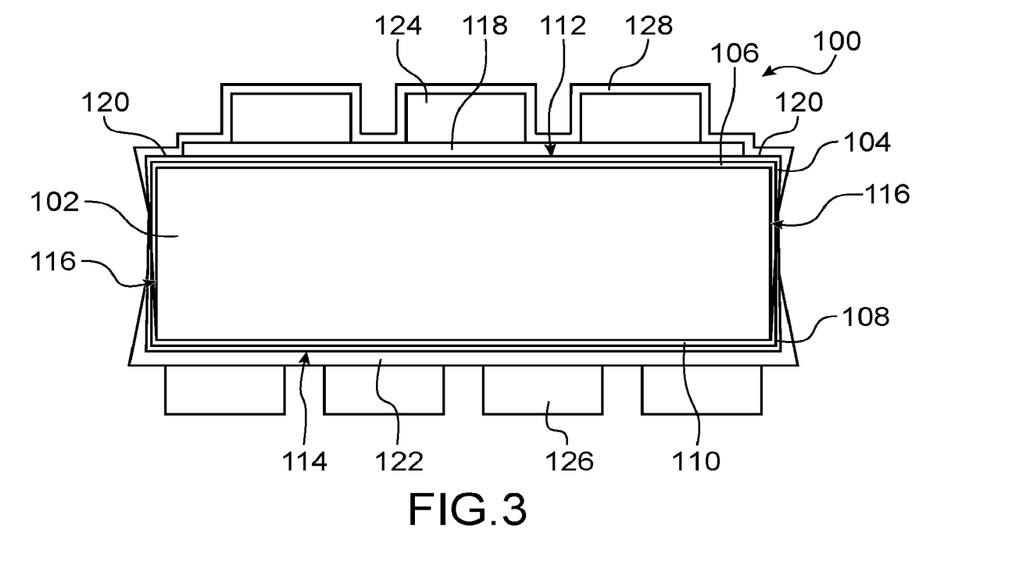

A photovoltaic cell 100 according to a third embodiment is described below in relation to FIG. 3.

As in the second embodiment described above, the non-reflective coating 128 does not form an envelope surrounding all the various elements of the cell 100. On the contrary, in this third embodiment, the non-reflective coating 128 covers only:

- the second parts of the first charge-collecting layer 104 disposed on the same side as the lateral faces 116 of the substrate 102 and the edges 120 of the first main face 112, and
- the first layer of TCO 118 and the first electrically conductive contacts 124 disposed against the first layer of TCO 118.

In this third embodiment, the non-reflective coating 128 is not in contact with the second layer of TCO 122. The material of the non-reflective coating 128 can therefore be dielectric or electrically conductive. Such an electrically conductive material able to serve as a non-reflective coating 128 corresponds for example to a TCO such as ITO or to ZnO:Al (aluminium doped zinc oxide, or AZO).

In this third embodiment, the non-reflective coating 128 is for example deposited by PECVD (plasma enhanced chemical vapour deposition) or PVD (physical vapour deposition), with the cell 100 disposed on a support so that the second layer of TCO 122 is located on the same side as this support, and by masking the second parts of the second charge-collecting layer 108 disposed on the same side as the lateral faces 116 of the substrate 102 and which are not covered by the second layer of TCO 122.

Figure 4:
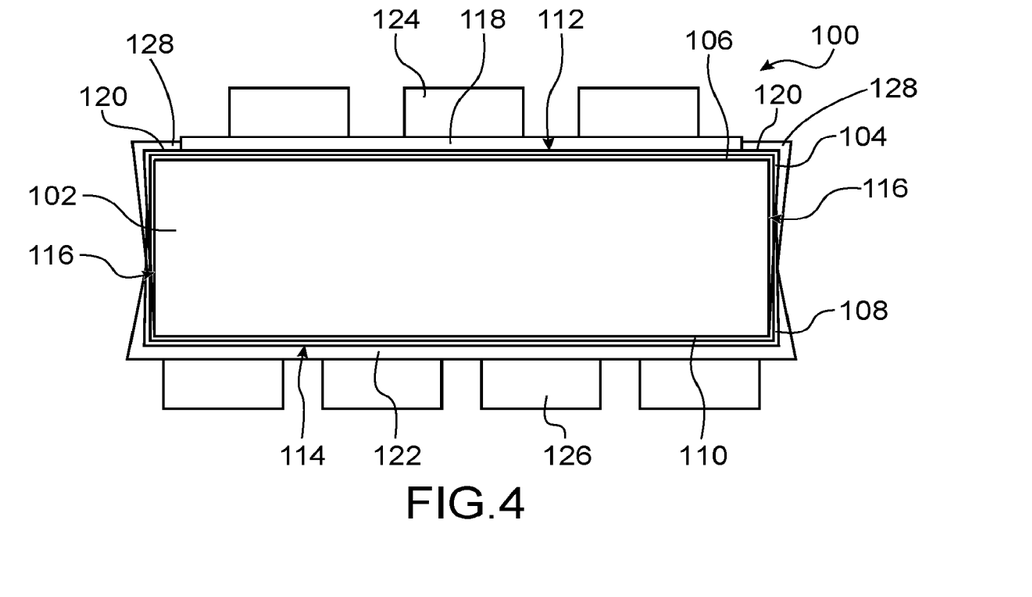

A photovoltaic cell 100 according to a fourth embodiment is described below in relation to FIG. 4.

As in the second and third embodiments described above, the non-reflective coating 128 does not form an envelope surrounding all the various elements of the cell 100. On the contrary, in this fourth embodiment, the non-reflective coating 128 covers:

- the second parts of the first and second charge-collecting layers 104, 108 disposed on the same side as the lateral faces 116 of the substrate 102 and not covered by the second layer of TCO 122, and
- the edges 120 of the first main face 112.

In this fourth embodiment, it is possible for the non-reflective coating 128 to be in contact with the second layer of TCO 122. Thus, to avoid any risk of short-circuit, the material of the non-reflective coating 128 is preferably dielectric.

In this fourth embodiment, the non-reflective coating 128 is for example deposited by PECVD (plasma enhanced chemical vapour deposition) or PVD (physical vapour deposition), with the cell 100 disposed on a support so that the second layer of TCO 122 is located on the same side as the support, and using an element masking, during this deposition, the first layer of TCO 118.

Figure 5:
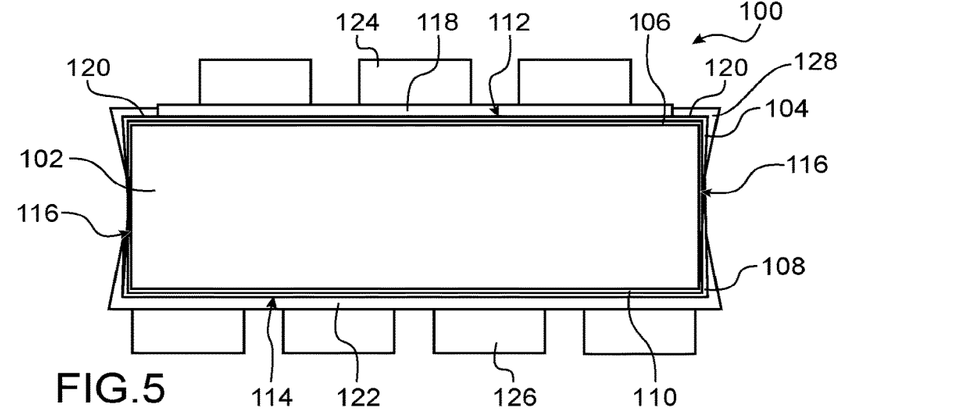

A photovoltaic cell 100 according to a fifth embodiment is described below in relation to FIG. 5.

In this fifth embodiment, the non-reflective coating 128 does not form an envelope surrounding all the various elements of the cell 100, and covers only the parts of the first charge-collecting layer 104 disposed on the same side as the lateral faces 116 of the substrate 102 and the edges 120 of the first main face 112.

In this fifth embodiment, the non-reflective coating 128 is for example deposited by PECVD (plasma enhanced chemical vapour deposition) or PVD (physical vapour deposition), with the cell 100 disposed on a support so that the second layer of TCO 122 is located on the same side as this support, and using an element masking, during the deposition, the first layer of TCO 118 and the parts of the portions of the second charge-collecting layer 108 disposed on the same side as the lateral faces 116 of the substrate 102 and which are not covered by the second layer of TCO 122. As in the third embodiment, the material of the non-reflective coating 128 may be dielectric or electrically conductive.

Figure 6:
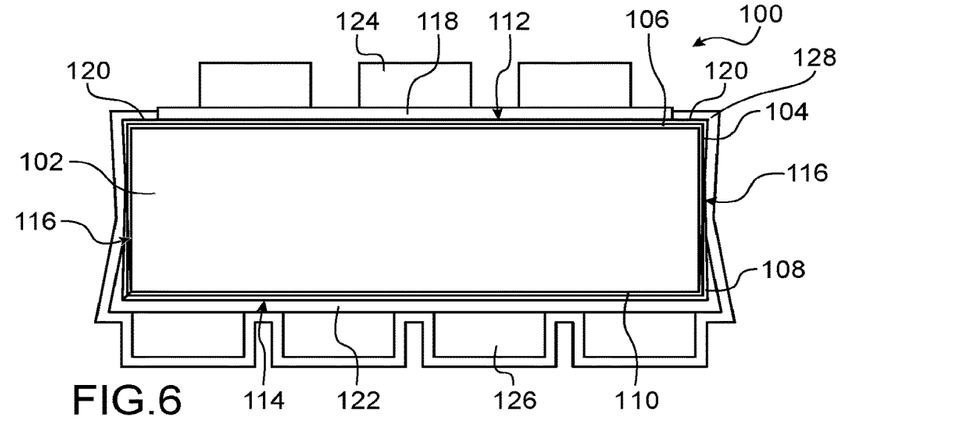

A photovoltaic cell 100 according to a sixth embodiment is described below in relation to FIG. 6.

In this sixth embodiment, the non-reflective coating 128 does not form an envelope surrounding all the various elements of the cell 100, and covers:
  the second parts of the first and second charge-collecting layers 104, 108 disposed on the same side as the lateral faces 116 of the substrate 102 and the edges 120 of the first main face 112, and
  the second layer of TCO 122 and the second electrically conductive contacts 126 disposed against the second layer of TCO 122.

In this sixth embodiment, the non-reflective coating 128 is for example deposited by PECVD (plasma enhanced chemical vapour deposition) or PVD (physical vapour deposition). It is for example possible to deposit first of all the non-reflective coating 128 on the same side as the first main face 112 so that it covers only the parts of the first and second charge-collecting layers 104, 108 disposed on the same side as the lateral faces 116 of the substrate 102 and the edges 120 of the first main face 112, and then by implementing a second deposition on the same side as the second main face 114 in order to result in the configuration shown on FIG. 6.

Variants of the various embodiments described above can be envisaged. For example, considering the fourth embodiment described above it is possible for the non-reflective coating 128 to partially cover the first layer of TCO 118 and optionally some of the first electrically conductive contacts 124.

In the various example embodiments described above, the substrate 102 and the first charge-collecting layer 104 include n-doped semiconductor, and the second charge-collecting layer 108 includes p-doped semiconductor. In a variant, for the various embodiments described above, it is possible for the substrate 102 and the first charge-collecting layer 104 to include p-doped semiconductor, and for the second charge-collecting layer 108 to include n-doped semiconductor.

In the various example embodiments described above, the passivation layers 106, 110 and the charge-collecting layers 104, 108 include amorphous semiconductor. In a variant, it is possible for these layers 104, 106, 108 and 110 to include microcrystalline or nanocrystalline semiconductor.

In the various example embodiments described above, the cells 100 are of the inverse emitter type, i.e. the emitters of the cells (corresponding to the second charge-collecting layer 108) are formed on the side of the cells 100 that is not intended to directly receive light radiation. In a variant, it is possible for the cells 100 to be of the standard emitter type, i.e. such that the emitters of the cells are formed on the side of the cells 100 intended to receive direct light radiation.

In the various example embodiments described above, the cell 100 corresponds to a heterojunction cell formed by means of a crystalline semiconductor substrate and thin layers of amorphous (or microcrystalline or nanocrystalline) silicon deposited on this substrate.

In a variant of all the embodiments described above, the cell 100 may correspond to a cell of the TOPCon type. In this case, the passivation layers 106, 110 correspond to tunnel oxide layers comprising for example $Si_xO_y$ and the thickness of which is for example between 1 nm and 5 nm. In such a TOPCon cell, the first and second charge-collecting layers 104, 108 include doped polycrystalline semiconductor (for example silicon) (first charge-collecting layer 104 n-doped and second charge-collecting layer p-doped 108 when the substrate 102 includes n-doped semiconductor).

Figure 7:
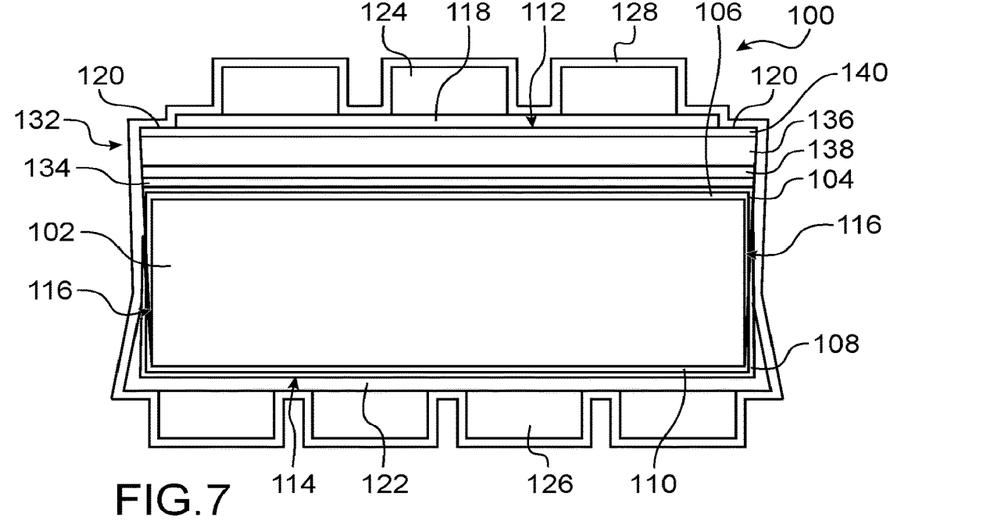
FIG. 7 shows a photovoltaic cell of the tandem on semiconductor type and with non-reflective coating according to a particular embodiment.

FIG. 7 shows another embodiment of the photovoltaic cell 100. In this other embodiment, the cell 100 is of the tandem on semiconductor type, and advantageously with a perovskite on silicon (PK/Si) structure.

The cell 100 according to this other embodiment includes the substrate 102, the first and second passivation layers 106, 110 and the first and second charge-collecting layers 104, 108 that form a bottom cell 130. The characteristics of the substrate 102 and the layers 104, 106, 108 and 110 (materials, thicknesses, deposition techniques used for producing them, etc.) are for example similar to those described above for a heterojunction cell 100.

The cell 100 according to this other embodiment also includes a top cell 132 disposed on a recombination layer 134 formed in advance on the bottom cell 130. The recombination layer 134 includes for example TCO (ITO, AZO). The top cell 132 includes a layer of material with a perovskite structure 136 including for example $Cs_xFA_{1-x}Pb(I_yBr_{1-y})_3$, and the thickness of which is for example between 200 nm and 1 µm. The layer 136 is disposed between a first charge-collecting layer 138, which includes for example an autoassembled monolayer 2PACz, MeO-2PACz or Me-4PACz as described in the document WO 2019/207029 A1, and the thickness of which is between 0.1 nm and 3 nm, and a second charge-collecting layer 140 including for example fullerene (=C60) and $SnO_2$ and the thickness of which is for example between 0.1 nm and 30 nm. The layers 134, 136, 138 and 140 are for example produced by the successive implementation of deposition steps on the bottom cell 130. Other details of embodiment of such a cell are indicated in the document "Co-Evaporated Formamidinium Lead Iodide Based Perovskites with 1000 h Constant Stability for Fully Textured Monolithic Perovskite/Silicon Tandem Solar Cells" of Marcel Roß et al., Advanced Energy Materials, vol. 11, Issue 35, 2021.

In the structure thus obtained, a main face of the bottom cell 130 (the one located on the side opposite to the top cell 132) forms the second main face 114, and a main face of the top cell 132 (the one located on the side opposite to the bottom cell 130) forms the first main face 112.

As in the example embodiments described above, the cell 100 includes the first layer of TCO 118 disposed against a part of the first main face 112 (without covering the edges 120), and the second layer of TCO 122 covering the whole of the second main face 114 and also covering at least first parts of the first and second charge-collecting layers 104, 108 disposed on the lateral faces 116 of the substrate 102. The cell 100 also includes the first electrically conductive contacts 124 disposed against the first layer of TCO 118 and the second electrically conductive contacts 126 disposed against the second layer of TCO 122.

Finally, the cell 100 includes a non-reflective coating 128 covering at least second parts of the first charge-collecting layer 104 and/or of the second charge-collecting layer 108 disposed against the side of the lateral faces 116 of the substrate 102 and not covered by the second layer of TCO 122, and also covering the edges 120 of the first main face 112. In the example embodiment shown on FIG. 7, the coating 128 also covers:
  the first layer of TCO 118 and the first electrically conductive contacts 124 disposed against the first layer of TCO 118, and the second layer of TCO 122 and the second electrically conductive contacts 126 disposed against the second layer of TCO 122.

However, all the configurations described above in relation to FIGS. 1 to 6 can apply to the cell 100 of the tandem on semiconductor type.

The various steps implemented for producing the cell 100 can be implemented collectively to simultaneously produce a plurality of photovoltaic cells.

In the example embodiments described above, the non-reflective coating 128 is deposited on the cell 100 before the latter is electrically connected to other photovoltaic cells. In a variant, it is possible for the non-reflective coating 128 to be deposited on a plurality of photovoltaic cells 100 that are already electrically connected to one another.

The invention claimed is:

1. A photovoltaic cell comprising at least:
   an assembly comprising at least one p-n junction including at least one crystalline semiconductor substrate doped according to a first conductivity type, first and second passivation layers covering respectively first and second opposite main faces of the substrate and each also covering lateral faces of the substrate, a first charge-collecting layer configured for extracting and collecting charges of the first type of conductivity and disposed against the first passivation layer, and a second charge-collecting layer configured for extracting and collecting charges of a second type of conductivity, opposite to the first type of conductivity, and disposed against the second passivation layer, said assembly furthermore comprising a first main face disposed on the same side as the first main face of the substrate and a second main face disposed on the same side as the second main face of the substrate;
   a first layer of conductive transparent oxide disposed against a part of the first main face of the assembly and such that edges of the first main face of the assembly are not covered with the first layer of conductive transparent oxide;
   a second layer of conductive transparent oxide covering the whole of the second main face of the assembly and partially covering first parts of at least one of the first charge-collecting layer and of the second charge-collecting layer disposed on the same side as the lateral faces of the substrate;
   electrically conductive contacts disposed against the first and second layers of conductive transparent oxide;
   a non-reflective coating at least partially covering second parts of at least one of the first charge-collecting layer and of the second charge-collecting layer disposed on the lateral faces of the substrate and not covered with the second layer of conductive transparent oxide, and also covering the edges of the first main face.

2. The photovoltaic cell according to claim 1, wherein the non-reflective coating furthermore covers the first layer of conductive transparent oxide and the electrically conductive contacts disposed against the first layer of conductive transparent oxide.

3. The photovoltaic cell according to claim 1, wherein the non-reflective coating is dielectric and furthermore at least partially covers the second layer of conductive transparent oxide and the electrically conductive contacts disposed against the second layer of conductive transparent oxide.

4. The photovoltaic cell according to claim 1, wherein the edges of the first main face form, in a plane parallel to the first main face, a contour with a width of less than or equal to 500 μm.

5. The photovoltaic cell according to claim 1, wherein the non-reflective coating includes at least one of the following materials: silicon nitride, silicon oxide, silicon oxynitride, aluminium-doped zinc oxide.

6. The photovoltaic cell according to claim 1, wherein the non-reflective coating has a refractive index the value of which is between that of the refractive index of the first layer of conductive transparent oxide and that of a material encapsulating the photovoltaic cell.

7. The photovoltaic cell according to claim 1, wherein the non-reflective coating forms a layer with a thickness of between 5 nm and 100 nm.

8. The photovoltaic cell according to claim 1, wherein the semiconductor of the substrate and of the first and second charge-collecting layers includes silicon.

9. The photovoltaic cell according to claim 1, wherein:
   the photovoltaic cell is a heterojunction cell, and
   the first and second passivation layers include amorphous, or nanocrystalline, or microcrystalline semiconductor, not intentionally doped, and
   the first and second charge-collecting layers include doped amorphous, or nanocrystalline, or microcrystalline semiconductor.

10. The photovoltaic cell according to claim 1, wherein:
    the photovoltaic cell is of the TOPCon type, and
    the first and second passivation layers correspond to tunnel oxide layers, and
    the first and second charge-collecting layers include doped polycrystalline semiconductor.

11. The photovoltaic cell according to claim 1, wherein:
    the photovoltaic cell is of the tandem on semiconductor type, and
    the substrate, the first and second passivation layers and the first and second charge-collecting layers form a bottom cell of the photovoltaic cell, a main face of the bottom cell forming the second main face of said assembly;
    said assembly furthermore includes a top cell disposed on the bottom cell, a main face of the top cell being able to form the first main face of said assembly.

12. The photovoltaic cell according to claim 11, wherein the top cell includes at least one layer of material with a perovskite structure.

13. A method for producing a photovoltaic cell, including the implementation of the following steps:
    producing an assembly comprising at least one p-n junction including at least one crystalline semiconductor substrate doped according to a first conductivity type, first and second passivation layers respectively covering first and second opposite main faces of the substrate and each also covering lateral faces of the substrate, a first charge-collecting layer configured for extracting and collecting charges of the first conductivity type and disposed against the first passivation layer, and a second charge-collecting layer configured for extracting and collecting charges of a second conductivity type, opposite to the first conductivity type, and disposed against the second passivation layer, said assembly furthermore comprising a first main face disposed on the same side as the first main face of the substrate and a second main face disposed on the same side as the second main face of the substrate;
    producing a first layer of conductive transparent oxide disposed against a part of the first main face of the assembly and so that the edges of the first main face of the assembly are not covered by the first layer of conductive transparent oxide;

producing a second layer of conductive transparent oxide covering the whole of the second main face of the assembly and partially covering first parts of at least one of the first charge-collecting layer and of the second charge-collecting layer disposed on the lateral faces of the substrate;

producing electrically conductive contacts disposed against the first and second layers of conductive transparent oxide;

producing a non-reflective coating at least partially covering second parts of at least one of the first charge-collecting layer and of the second charge-collecting layer disposed on the same side as the lateral faces of the substrate and not covered by the second layer of conductive transparent oxide, and also covering the edges of the first main face.

14. The method according to claim 13, wherein the steps of the method form a plurality of photovoltaic cells;

the method furthermore includes a step of electrical interconnection of the photovoltaic cells with each other, implemented between the production of the electrically conductive contacts of the cells and the production of the non-reflective coating.

\* \* \* \* \*